(12) United States Patent
Kuhmann et al.

(10) Patent No.: US 7,213,978 B2
(45) Date of Patent: May 8, 2007

(54) OPTICAL DEVICE RECEIVING SUBSTRATE AND OPTICAL DEVICE HOLDING CARRIER

(75) Inventors: Jochen Friedrich Kuhmann, Copenhagen (DK); Matthias Heschel, Rodovre (DK)

(73) Assignee: Hymite A/S, Kgs. Lyngby (DK)

( * ) Notice: Subject to any disclaimer, the term of this patent is extended or adjusted under 35 U.S.C. 154(b) by 195 days.

(21) Appl. No.: 10/437,543

(22) Filed: May 14, 2003

(65) Prior Publication Data

US 2003/0215194 A1    Nov. 20, 2003

Related U.S. Application Data

(60) Provisional application No. 60/380,287, filed on May 15, 2002.

(51) Int. Cl.
  G02B 6/36    (2006.01)
  G02B 6/26    (2006.01)
  G02B 6/00    (2006.01)
(52) U.S. Cl. .............................. 385/92; 385/52; 385/88
(58) Field of Classification Search ............ 385/88–94
  See application file for complete search history.

(56) References Cited

U.S. PATENT DOCUMENTS

| | | | |
|---|---|---|---|
| 4,896,936 A * | 1/1990 | Stanley ........................ 385/14 |
| 5,023,881 A | 6/1991 | Ackerman et al. | |
| 5,432,878 A * | 7/1995 | Smous ......................... 385/52 |
| 5,488,678 A * | 1/1996 | Taneya et al. ................. 385/14 |
| 5,721,797 A | 2/1998 | Basavanhally et al. | |
| 5,991,484 A * | 11/1999 | Harpin et al. .................. 385/49 |
| 6,070,130 A * | 5/2000 | Gutmann et al. .............. 702/81 |
| 6,093,939 A | 7/2000 | Artigue et al. | |
| 6,140,689 A * | 10/2000 | Scheiter et al. ............. 257/414 |
| 6,164,836 A | 12/2000 | Yamada et al. | |
| 6,458,513 B1 * | 10/2002 | Yu et al. ..................... 430/313 |
| 6,595,700 B2 * | 7/2003 | Steinberg et al. ............. 385/92 |
| 6,738,145 B2 * | 5/2004 | Sherrer et al. ............... 356/480 |
| 6,747,472 B2 * | 6/2004 | Magerlein et al. .......... 324/765 |
| 6,786,654 B2 | 9/2004 | Kilian | |
| 2002/0076133 A1 * | 6/2002 | Li et al. ........................ 385/16 |
| 2003/0012925 A1 * | 1/2003 | Gorrell ........................ 428/137 |

* cited by examiner

Primary Examiner—Sung Pak
(74) Attorney, Agent, or Firm—Fish & Richardson P.C.

(57) ABSTRACT

An optical structure includes a substrate for receiving an optical device. The substrate may hold waveguide reference surfaces for vertical alignment of the device to a waveguide core of the substrate. A carrier for holding the optical device has contact surface parts for holding the optical device and for mounting the carrier to an optical device receiving substrate.

30 Claims, 10 Drawing Sheets

OPTICAL DEVICE RECEIVING SUBSTRATE AND OPTICAL DEVICE HOLDING CARRIER

CROSS-REFERENCE TO RELATED APPLICATION(S)

This application claims priority from U.S. Provisional Patent Application No. 60/380,287, filed May 15, 2002.

FIELD OF THE INVENTION

The invention relates to an optical structure including a substrate for receiving an optical device. The substrate may hold waveguide reference surfaces for vertical alignment of the optical device to a waveguide core of the substrate. The invention also relates to a carrier for holding an optical device, where the carrier holds contact surface parts for holding the optical device and for mounting the carrier to an optical device receiving substrate. The invention furthermore relates to a method for assembling an optical structure and a method of producing an optical structure.

BACKGROUND OF THE INVENTION

Recent developments in optical technology have led to the construction of optical components such as laser chips and photo-sensor chips having relatively small dimensions of the order of 200 microns (μm). Proposals have been made to mount the optical components on substrates and to align them accurately with optical waveguides or other optical components. It may be difficult, however, to hold the component accurately using a micromanipulator or the like during mounting of the component on a substrate.

SUMMARY OF THE INVENTION

The present invention is related to an optical structure for assembling an optical or optoelectronic component with a substrate structure having a waveguide. In a typical situation this may be a laser or photo diode, which is to be integrated with a planar lightwave circuit (PLC). The objective when integrating an optical or optoelectronic component is to couple light to/from the component from/to the waveguide of the substrate, and it is therefore crucial to have a precise vertical and horizontal alignment between the waveguide and the component.

The present invention permits an accurate vertical alignment between the waveguide and a carrier holding the component, which is not dependent on the relative thickness of layers formed in different process steps such as growth, etching or similar. Furthermore, the invention allows for testing and active horizontal alignment of components prior to irreversible fastening to the substrate structure.

In a first aspect, the present invention provides an optical structure comprising a substrate structure having a support layer supporting a core layer of a waveguide structure. The substrate structure is provided with a recess extending below the core layer, with the recess being adapted to receive an optical or optoelectronic component. The core layer may have one or more uncovered parts to provide one or more upper waveguide height reference surface parts in plane with an upper surface of the core layer of the waveguide. Alternatively (or in addition), the support layer may have one or more uncovered parts to provide one or more lower waveguide height reference surface parts in plane with a lower surface of the core layer of the waveguide. A carrier structure has one or more first contact surface part(s) for mounting of the optical or optoelectronic component and one or more second contact surface part(s) for mounting the carrier structure on the substrate structure, with the first and second contact surface parts having well defined relative vertical positions. The one or more first contact surface parts are adapted to contact an upper surface part of the optical or optoelectronic component, and the one or more second contact surface parts are adapted to rest on one or more of the upper or lower waveguide height reference surface parts of the substrate structure for providing vertical alignment between the waveguide core of the substrate structure and the one or more first contact surface parts of the carrier structure.

Thus, the invention may provide waveguide height reference surface parts which are in precise vertical alignment with the waveguide of the substrate structure, namely by providing height reference surface parts formed by the waveguide core layer itself or the layer supporting the waveguide core layer. In the present description, the term "alignment" is meant to designate a well defined translational relation between two objects such as surface parts, cores or the like. Thus, when two objects are aligned it does not necessarily mean that they lie in the same plane or along the same line, but that they lie in planes or lines which are at least substantially parallel to each other and which have a well defined distance to each other.

Typically, a waveguide structure of a substrate structure is a planar waveguide formed by a bottom cladding layer forming the support layer supporting a core layer, the bottom cladding layer material having a higher refractive index than the core layer material. The thickness of the core layer is preferably in the range of 4–8 μm, such as in the range of 5.5–6.5 μm. Then the core layer is treated so as to form a core for controlling the direction of propagation of the electromagnetic waves, e.g. by removing or doping parts of the layer. The core is then covered by a top cladding layer, typically of the same material as the bottom cladding layer, thereby forming the waveguide structure. In a preferred embodiment, the substrate structure may be a semiconductor structure.

The well-defined relative vertical positions of the fist and second contact surface parts of the carrier ensure that no vertical misalignment is introduced by the carrier structure. The first and second contact surface parts preferably lies in at least substantially the same plane. Typically, the contact surface parts are formed in a photolithographic process, where the contact surface parts are formed from the same material layer by removing the parts of the material layer, such as surrounding parts, by etching. Alternatively, the contact surface parts or the mounting structures may be form by epitaxy such as local epitaxial growth. The precisions of these processes in the vertical direction, the direction of the thickness of the layers, are not very well defined. Therefore the relative vertical positions of the first and second contact surface part(s) are preferably defined in the same process step(s) during the formation of the carrier structure, so as to exclude misalignment between surface parts formed in different process steps. Optionally, the first and second contact surface parts may be different parts of the same surface part of a single structure.

The first contact surface parts may be formed by terminal surface parts of first mounting structure for mounting of an optical or optoelectronic component onto the carrier structure. Similarly, the second contact surface parts may be formed by terminal surface parts of second mounting structure for mounting the carrier structure on the substrate structure. In an embodiment comprising the first and second mounting structures, these will typically be raised structures formed on or in the underside of the carrier structure. In this embodiment, it may be the heights of the first and second mounting structures, which are defined in the same process step(s). The first and second mounting structures may of course be formed by the same structure.

The first and second contact surface parts may play a role in the horizontal alignment in the mounting of the carrier structure on the substrate structure, or in the mounting of the component on the carrier structure. Therefore, it may be important to have precise relative horizontal positions between the first and second contact surface parts. A photolithographic mask typically defines the horizontal position of each contact surface part. The positioning of a mask before illumination may not be very precise whereby the relative positions of the first and second contact surface parts is not very precise. Therefore, the relative horizontal positions of the first contact surface part(s) and the second contact surface part(s) may be defined in a single mask process step during the formation of the carrier structure in order to ensure a precise relative position.

These details together with the waveguide height reference surface parts, establishes a very precise vertical relation between the core of the waveguide and the first contact surface parts for holding the component to be aligned with the waveguide.

Thus, the optical structure preferably further comprises:
an optical or optoelectronic component with a waveguiding part,
wherein the optical or optoelectronic component is attached to the carrier structure with at least one of the first contact surface parts contacting a surface part, such as an upper surface part, of the optical or optoelectronic component, and
wherein the carrier structure is attached to the substrate structure with the optical or optoelectronic component being at least partly received in the recess, with at least one of said second contact surface parts resting on at least one of the upper or lower waveguide height reference surface parts of the substrate structure, thereby providing vertical alignment between the waveguide core of the substrate structure and the optical or optoelectronic component.

The optical or optoelectronic component will also be referred to as "the component". The waveguide core of the substrate structure and the waveguiding part of the component preferably have opposite end parts when the component is mounted in the recess so as to allow coupling of light between them.

The core of the substrate structure is now precisely aligned with an upper surface part of the component. Whether it is also aligned with the waveguiding part of the component depends on the vertical relation between the waveguiding part and said upper surface part of the component. Preferably, The core of the waveguide on the substrate has a thickness greater than the thickness of the waveguiding part of the component. Thereby, the waveguiding part may simply be positioned within the "margins" defined by the upper and lower surface of the waveguide, which introduces some flexibility in the design of the component. In the following, two schemes related to the positioning of the waveguiding part in the component are described.

If the upper surface of the waveguiding part is arranged in plane with or below the upper surface part of the component abutting the first contact surface part(s), then at least one of the second contact surface parts is preferably resting on a upper waveguide height reference surface part. In this scenario, the waveguiding part is preferably buried at a first distance below the upper surface part of the component, said first distance being the distance from the upper surface part of the component abutting the first contact surface part(s) to the upper surface of the waveguiding part, and said first distance being smaller than the thickness of the core of the waveguide. Preferably, the first distance is in the range of 1–6 μm such as in the range 2.5–3.5 μm.

If the lower surface of the waveguiding part is arranged in plane with or above the upper surface part of the component abutting a first contact surface part, then at least one of the second contact surface parts is preferably resting on a lower waveguide height reference surface part. In this scenario, the waveguiding part is preferably arranged at a second distance above the upper surface part of the component, said second distance being the distance from the upper surface part of the component abutting the first contact surface part(s) to the lower surface of the waveguiding part, and said second distance being smaller than the thickness of the core of the waveguide. Preferably, the first distance is in the range of 1–6 μm such as in the range 2.5–3.5 μm.

The waveguiding part of the component may for example be a ridge formed waveguiding part or a buried waveguiding part. Preferably, the waveguiding part of the optical or optoelectronic component has a thickness in the range of 2–5 μm, such as in the range of 2.5–3.5 μm. In a preferred embodiment, the component is an optoelectronic component selected from the group consisting of laser diodes, photodiodes, semiconductor optical amplifiers and modulators.

The carrier structure preferably has an upper part and a lower part with the first and second contact surface parts being arranged on the lower part. Also, the carrier structure is preferably a semiconductor-insulator-semiconductor structure with an upper semiconductor structure having a height or thickness being larger than a height or thickness of a lower semiconductor structure.

The carrier structure according to the present invention may be specifically adapted to provide power to optoelectronic components held by the carrier. This allows for the optoelectronic component to be powered and thereby tested before mounting of the carrier structure with component on the substrate structure. Hence, the carrier structure preferably provides through holes from the upper part of the carrier structure to the lower part holding the optoelectronic component and one or more electrical contacts for the optoelectronic component via said through holes. Optionally, said through-holes may be hermetically sealed, preferably by means of a feed-through metallization process.

In a second aspect, the present invention provides an optical carrier structure as described in relation to the first aspect of the invention, the optical carrier structure comprising:
an upper semiconductor structure, a lower semiconductor structure, and a substantially etch-resistant layer arranged between the upper and lower semiconductor structure,
wherein the lower semiconductor structure comprises one or more first contact surface part(s) for mounting of an optical or optoelectronic component, and one or more second contact surface part(s) for mounting the carrier structure on a substrate structure.

The upper semiconductor structure preferably has a height or thickness is at least 2 times, such as 3, 4, or even 5 timer greater height or thickness of the lower semiconductor structure.

Preferably, one or more electrical contacts are provided for the component via through holes from the upper semiconductor structure, through the etch-resistant layer to the lower semiconductor structure. Said one or more electrical contacts may also provide an electrical connection to the substrate structure via the upper semiconductor structure.

In a third aspect, the present invention provides a method of producing an optical structure as described in relation to the first aspect of the invention, the method comprising the steps of:

providing a substrate structure having a layer in which a waveguide is formed, providing a carrier structure being adapted to carry a component, providing a component comprising a waveguiding part, providing the substrate structure with a recess extending at least below the waveguide layer, said recess being adapted to receive a component, providing the carrier structure with one or more first contact surface part(s) for mounting the component on the carrier structure, and one or more second contact surface part(s) for mounting the carrier structure on the substrate structure, wherein the first and second contact surface parts lies at least substantially in the same plane, mounting the component on the carrier structure by abutting the first contact surface part(s) to an upper surface part of the component and at least temporarily attaching the component to the carrier structure, exposing upper surface parts of the waveguide layer of the substrate structure and/or parts of an upper surface of the layer supporting the waveguide layer of the substrate structure, said exposed part(s) thereby providing one or more height reference surface parts, and mounting the carrier structure carrying the component on the substrate structure in such a way that the optical structure is received in the recess by supporting the second contact surface part(s) on at least one of the one or more height reference surface parts of the substrate structure.

Preferably, the step of providing the carrier structure with the first and second contact surface part(s) comprises defining the height of the first and second contact surface part(s) in the same process step(s) during the formation of the carrier structure. Typically, mounting structures having the contact surface parts as terminal surface parts are formed in a photolithographic process, where the mounting structures formed from the same material layer by removing the surrounding material by etching.

Alternatively, the first and second contact surface parts may be form by epitaxy such as local epitaxial growth.

Optionally, the step of mounting the carrier structure on the substrate structure comprises the step of at least temporarily attaching the carrier structure to the substrate structure by pre-bonding performed using UV curable glue dispensed at at least one point on the carrier or on the substrate structure.

In a preferred method, the step of providing a carrier structure comprises the steps of:

providing one or more through-holes from the upper part to the lower part of the carrier structure, and providing one or more electrical contacts for the component via said through-holes.

Further, the step of providing a carrier structure may comprise providing the upper part as an upper semiconductor layer, such as a silicon layer, and providing the lower part as a lower semiconductor layer, such as a silicon layer, and arranging a substantially etch resistant insulator layer between the first and the second semiconductor layer.

Also, in said preferred method, the step of providing one or more through-holes preferably comprises:

etching through the first semiconductor layer from the first outer surface, stopping the etching through the first semiconductor layer when the substantially etch resistant layer is reached, etching through the second semiconductor layer from the second outer surface, and stopping the etching through the second semiconductor layer when the substantially etch resistant layer is reached, the substantially etch resistant layer thereby defining an etch stop.

The one or more through-holes may be hermetically sealed, preferably by means of a feed-through metallization process.

One possible advantage of the method according to the third aspect of the invention is that it allows for the component to be powered already when mounted on the carrier structure. Thus, the method may further comprise the step of testing the component after mounting it on the carrier structure and prior to the mounting of the carrier structure to the substrate structure. Also, the method may further comprise the step of providing at least one electrical feedback connection from the component to the substrate structure via at least one of the one or more through-holes.

In a fourth aspect, the present invention provides a method of assembling an optical structure, said method comprising:

mounting each of one or more substantial identical optical or optoelectronic components onto a corresponding carrier structure, testing each of said one or more optical or optoelectronic components when mounted on the corresponding carrier structure, selecting a carrier structure holding an optical or optoelectronic component, which has passed the test procedure, and securing or mounting the selected carrier structure holding the tested optical or optoelectronic component onto a substrate structure, said substrate structure having a substrate waveguide for being optically coupled to the tested optical or optoelectronic component.

In a preferred embodiment, the method further comprises the step of providing the carrier structures and the optical or optoelectronic components, these being the carrier structure and the component described in relation to the first aspect of the invention.

Preferably, the method further comprises the steps of performing an optical alignment of the mounted and tested component with the substrate waveguide before the step of securing the selected carrier structure to the substrate structure. In a preferred embodiment, the component is a light emitting type of optoelectronic component and in this case, the step of optically aligning may comprise powering of the optoelectronic component and monitoring the optical power transmitted through the substrate waveguide while moving the carrier to thereby move the optoelectronic component. Similarly, if the component is a light receiving optoelectronic component, the step of optically aligning may comprise monitoring an electric signal from the optoelectronic component and thereby monitoring the optical power received by the optoelectronic component from the substrate waveguide while moving the carrier to thereby move the optoelectronic component. In order to power (or receive an electrical signal from) the optoelectronic component, the method may comprise the steps of providing electrical wiring in the carrier structure and connecting the optoelectronic component to the carrier structure with the electrical wiring when mounting it on the carrier structure.

In order to ensure a fast and gentle fastening of the carrier structure to the substrate structure, the method may comprise the step of pre-bonding the carrier structure to the substrate structure after the said optical alignment, preferably by using UV curable glue dispensed at at least one point on the carrier or on the substrate structure, so as to at least temporarily fix the carrier structure to the substrate structure.

The test procedure typically include a functional test of the one or more mounted optical or optical or optoelectronic components. In a preferred method, the test procedure includes a burn-in of each of the one or more mounted optical or optoelectronic components. By running the components at high currents for a shorter period of time, the wear of a normal operation over a longer period of time may be simulated. Thereby, the majority of the components that will wear out relatively fast can be detected and disposed prior to the mounting of the carrier structure on the substrate structure. In order to save time and resources in the testing procedure, the functional test of the mounted optical or optoelectronic components is preferably performed after the burn-in so that the functional testing are not wasted on the worn out components.

The method according to the fourth aspect may comprise the step of providing the carrier structure and the substrate structure so as to provide an at least partly vertical alignment between a core of the substrate waveguide and a waveguiding part of the optical or optoelectronic component when the selected carrier structure is secured or mounted to the substrate structure. In a preferred embodiment, the carrier structure and the substrate structure according to the first aspect of the present invention may be used.

Other features and advantages will be readily apparent from the following detailed description, the accompanying drawings and the claims.

BRIEF DESCRIPTION OF THE DRAWINGS

The invention will be further described in the following with the aid of the accompanying drawing, in which.

DETAILED DESCRIPTION OF PREFERRED EMBODIMENTS

Figure 1:
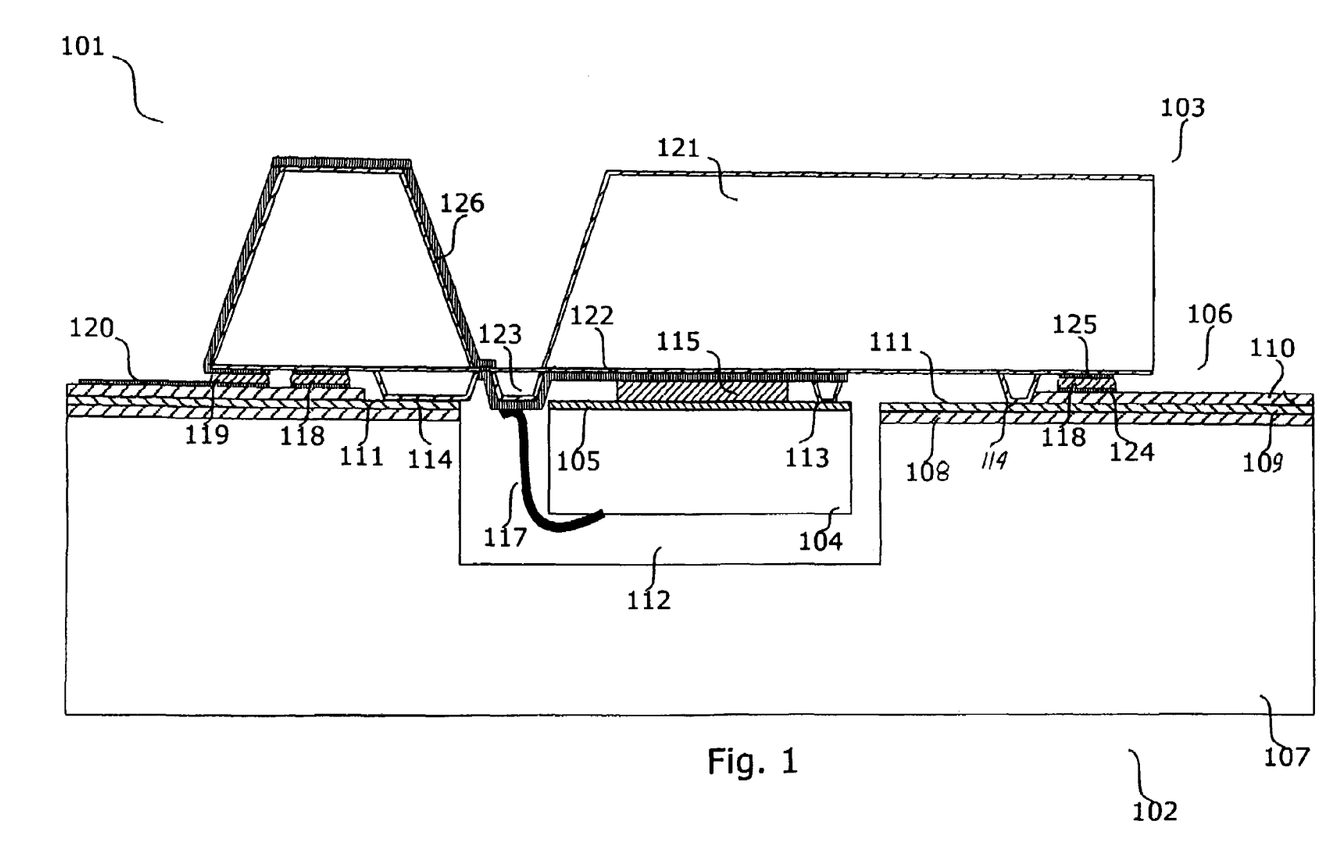
FIG. 1 is a cross-sectional side view of an embodiment of an optical structure according to the present invention.

FIG. 1 shows a cross-sectional side view of an optical structure 101 according to an embodiment of the present invention. The optical structure 101 is an assembled structure including a substrate structure 102, a carrier structure 103 and an optical or optoelectronic component 104. The optical or optoelectronic component 104 may be a light receiving component such as a photodiode or an active component such as a laser, a light emitting diode (LED) or an optical amplifier, Here, the optical or optoelectronic component 104 is an optoelectronic component of the laser type. The optical or optoelectronic component 104 is secured to the carrier structure 103, which again is secured to the substrate structure 102, so that the light guiding part or the active layer 105 of the component 104 is optically aligned with an optical wavelength part 106 formed on a substrate 107 of the substrate structure 102.

The optical wavelength part 106 includes a supporting core layer or a bottom cladding layer 108 on top of the substrate 107, a light guiding core layer 109 on top of the bottom cladding 108, and a top cladding layer 110 covering part of the core layer 109. The fabrication of the substrate structure 102 and the carrier structure 103 can be done using standard semiconductor technology.

When fabricating the semiconductor structure 102, the bottom cladding layer 108 is deposited on the substrate 107. Preferably the substrate 107 is composed of Silicon or other inorganic or organic substrate material; the bottom-cladding layer is SiO2 or other materials with a refractive index being different from that of the core material to be deposited later. The next step consists of covering the bottom cladding 108 with a deposited layer 109 of core glass, typically Germanium doped SiO2 or other materials with a refractive index being different from that of the cladding material.

The depositing of cladding layers 108, 110, and the core glass layer 109 can be carried out using Plasma Enhanced Chemical Vapour Deposition (PECVD), Low Pressure Chemical Vapour Deposition (LPCVD), or Flame Hydrolysis Deposition (FHD).

When the core layer 109 has been deposited, the light guiding waveguide core 128 (see FIG. 7) has to be defined. This includes a photolithography step followed by a Reactive Ion Etching (RIE) process for removing the unnecessary part or parts of the core layer 109. This mask step should also leave part or parts of the core layer 109 to be used as upper waveguide height reference surfaces 111. When using the core layer 109 itself to provide waveguide reference surfaces 111, a very precise vertical alignment may be obtained between the optical component 104 and the waveguide core 128 of the core layer 109.

In an alternative embodiment, the photolithography step used for defining the waveguide core 128 in the core layer 109, may leave part or parts of the bottom cladding 108 layer uncovered, whereby these uncovered parts can be used as lower waveguide height reference surfaces. Also here, when using the bottom cladding layer, which supports the waveguide core 128, as a waveguide reference surface, a very precise vertical alignment may be obtained between the optical component 104 and the waveguide core 128 of the core layer 109.

The waveguide core 128 has to be covered by a material for it to be able to guide electromagnetic radiation. There exist several choices of materials for embedding the waveguide core 128 for it to be able to guide electromagnetic radiation. These can be defined using parameters such as refractive index. Thus, a top cladding layer 110, preferably similar to the bottom cladding layer 108, is deposited on the remaining parts of the core layer and the uncovered parts of the bottom cladding 108. This top cladding layer 110 is removed again in an RIE process, but only from the parts of the structure, in which upper or lower waveguide height reference surfaces are defined.

A cavity or a recess 112 is provided in the substrate structure 102 to enable the optical or optoelectronic component 104 to be received therein. The recess 112 is provided through the cladding and core layers 108, 110 and 109 and into the substrate 107, and the depth of the recess 112 should be deep enough to receive the optical or optoelectronic component 104. However, in order to obtain a good sealing of the assembled optical structure 101, the recess 112 should not go through the substrate 107. The dimensions of the recess 112 will depend on the size of the optical component 104. Thus, the depth of the recess 112 is chosen to be large enough to allow the light guiding part 105 of the optical component 104 to be in vertical alignment with the core layer 109, and the length of the recess 112 is chosen to allow a good light transmission between the optical component 104 and the core 128 of the substrate structure 102. The width of the recess 112 is not critical but should be large enough to allow adjustment of the position of the optical or optoelectronic component 104 in order to obtain horizontal alignment of the light guiding part 105 to the core 128. The recess 112 may be provided by use of a suitable technique such a RIE process or a Deep RIE process.

When the optical component 104 is a laser diode, with typical dimensions of 1500 µm length, 400 µm width and 100 µm thickness, the length of the recess 112 will typically be 2000 µm, the depth of the recess will typically be 200 µm, and the width of the recess 112 will typically be 600 µm.

Typically dimensions for the substrate structure 102 may be as follows: length and width of several centimetres (depending on the functionality) thickness 600 µm, thickness of bottom cladding layer 108, 15 µm, thickness of core layer 109, 6 µm, and thickness of top cladding layer 110, 15 µm. The width of the defined waveguide core 128 may be 6 µm, and the width of the upper or lower waveguide height reference surfaces may be 500 µm.

The carrier structure 103 holds a first contact surface 113 for arrangement of the optical or optoelectronic component 104 and a second contact surface 114 for arrangement of the carrier structure 103 to the substrate structure 102. Here, the first contact surface 113 is in plane with the second contact surface 114, and it is preferred that they are made in the same steps of fabrication. For the embodiment shown in FIG. 1, the second contact surface 114 of the carrier structure 103 is arranged on the upper waveguide height reference surfaces 111 of the substrate structure 102, and the optical or optoelectronic component 104 has an upper surface mounted to the carrier structure 103 with the first contact surface 113 resting on part of the upper surface of the optical or optoelectronic component 104. Thus, the upper surface of the optical or optoelectronic component 104 is in plane with the lower surface of the second contact surface 114 and thereby in plane with the upper surface of the core layer 109.

It is preferred that the optical component 104 is a laser diode having a buried active layer 105 with a layer thickness of 1 µm and covered by a cladding layer having a thickness of 2–3 µm. The core layer 109 of the substrate structure 102 has a thickness of 6 µm, whereby the active layer of the component 104 is arranged in vertical alignment with the waveguide core 128.

For the alternative embodiment having lower waveguide height reference surfaces on top of the bottom cladding layer 108, it is preferred that the optical or optoelectronic component 104 is a ridge type optical or optoelectronic component having the active layer 105 formed on top of or above an upper surface of the component 104. Here, part of the upper surface, which is not covered by the active layer 105, may be used for fastening or mounting of the component 104 to the carrier structure 102 with the first contact surface 113 resting on the upper surface. Here, the active layer 105 may have a thickness of 1 µm and it may be arranged at a distance of 2–3 µm above the upper surface of the component 104. Again, the core layer 109 has a thickness of 6 µm, whereby the active layer of the component 104 is arranged in vertical alignment with the waveguide core 128.

By having the first and second contact surfaces 113, 114 made in the same process steps, the active layer 105 of the component 104 is vertical aligned with reference to the carrier structure, and by using the core layer 109 to provide upper waveguide reference surfaces 111 or the bottom cladding to provide lower waveguide reference surfaces, the carrier structure 103 is vertical aligned with reference to the core layer 109 of the substrate structure 102.

To mount the optical or optoelectronic component 104 to the carrier structure 102, a first electrode 115 is formed by a first metallization layer on the lower part of the carrier structure 103, and a second electrode 116 is formed by a second metallization layer on the lower part of the carrier structure 103. The optical or optoelectronic component 104 is soldered to the metallization layer of the first electrode 115, whereby the optical component 104 is secured to the carrier 103 and a first electrical contact is provided between the component 104 and the carrier 103. A second electrical contact is provided by having a wire 117 soldered to a contact on lower surface of the component 104 and the second metallization layer forming the second electrode 116 (see FIG. 2).

The carrier structure 103 is secured to the substrate structure 102 by use of a solder ring 118. It is preferred that the solder ring 118 provides a sealing closure between the carrier 103 and the substrate structure 102. A substrate metallization structure 124 is provided on the top cladding layer 110 and a carrier metallization structure 125 is provided on the lower surface of the carrier 103 in order to allow the soldering to be performed.

The carrier 103 has two feed-through metallizations 126, 127 (see FIG. 2) providing two current paths from the upper surface of the carrier 103, via two through-holes and down to the first and second electrodes 115, 116 at the bottom or lower part of the carrier 103. The feed-through metallizations 126, 127 may further provide current paths from the upper surface of the carrier 103, following the outside of the carrier 103 to the bottom side of the carrier 103. Here, solder interconnects 119 may provide contacts between the feed-through metallizations and contact metallizations 120 on the top cladding layer 110 of the substrate structure 102. The solder interconnects 119 are arranged outside the solder ring, whereby electrical contact can be obtained from the outside of the optical structure 101 and to the optical or optoelectronic component 104 arranged inside the optical structure 101.

The carrier 103 of FIG. 1 has a number of through-holes with corresponding through-hole connections 126, 127 for providing electrical connections from the outer surface of the carrier 103 to the inner surface of the carrier 103. A through-hole connection 126, 127 may have a corresponding through-hole formed in the carrier 103, and said through-hole may be hermetically sealed by the formation of the through-hole connections 126, 127. Such through-holes may be formed by one or more etching processes, which may include both a front layer etching and a back layer etching.

The carrier 103 may be formed from a pure single-crystalline silicon wafer. However, it is preferred to use a silicon-on-insulator (SOI) structure, and the carrier 103 of FIG. 1 has such a SOI structure. Here, the carrier structure 103 may comprise an upper part formed in a <100> single-crystalline silicon front layer 121, a silicon dioxide insulating layer 122, and a <100> single-crystalline back layer 123, in which the first and second contact surfaces 113, 114 are formed. The thickness of the back layer 123 is 20 μm±1 μm, the thickness of the silicon dioxide layer 122 is about 1 μm, and the thickness of the supporting front silicon layer 121 is 350 μm±25 μm. It is important that the silicon dioxide insulator 122 is thick enough to resist a double-sided through-hole etching. The resistivity of both the front layer 121 and the back layer 123 is about 1–20 Ωcm.

The front layer etching and the back layer etching are preferably performed using anisotropic etching processes. Here, the front layer etching is stopped when reaching the silicon dioxide insulating layer 122, which acts as an etch stop, and similarly, the back etching is stopped when reaching the silicon dioxide insulating layer 122 from the other side. Since the silicon front layer 121 is much thicker than then silicon back layer 123, the back layer etching is much shorter in time than the front layer etching.

A wafer of the SOI structure described above may be delivered by a wafer supplier such as for example SICO Wafer GmbH, Germany.

The formation of through-holes by use of a double-sided through-hole etching in a SOI structure is described in co-pending U.S. provisional application No. 60/329,699, which is hereby included by reference. In this application is also described how through-hole connections can be formed for providing electrical contact from the bottom of the structure to the top of the structure. It is further described how the formation of the through-hole connections may provide a hermetically sealing of the through-holes. It is further described how a solder ring may be provided on the structure in order to solder the carrier 104 to a substrate structure 102.

To better understand the optical structure of the present invention, FIGS. 2–9 illustrates in more details the carrier structure and the substrate structure of the optical structure of FIG. 1. The reference numerals used are the same as used in the above description given in connection with FIG. 1.

Figure 2:
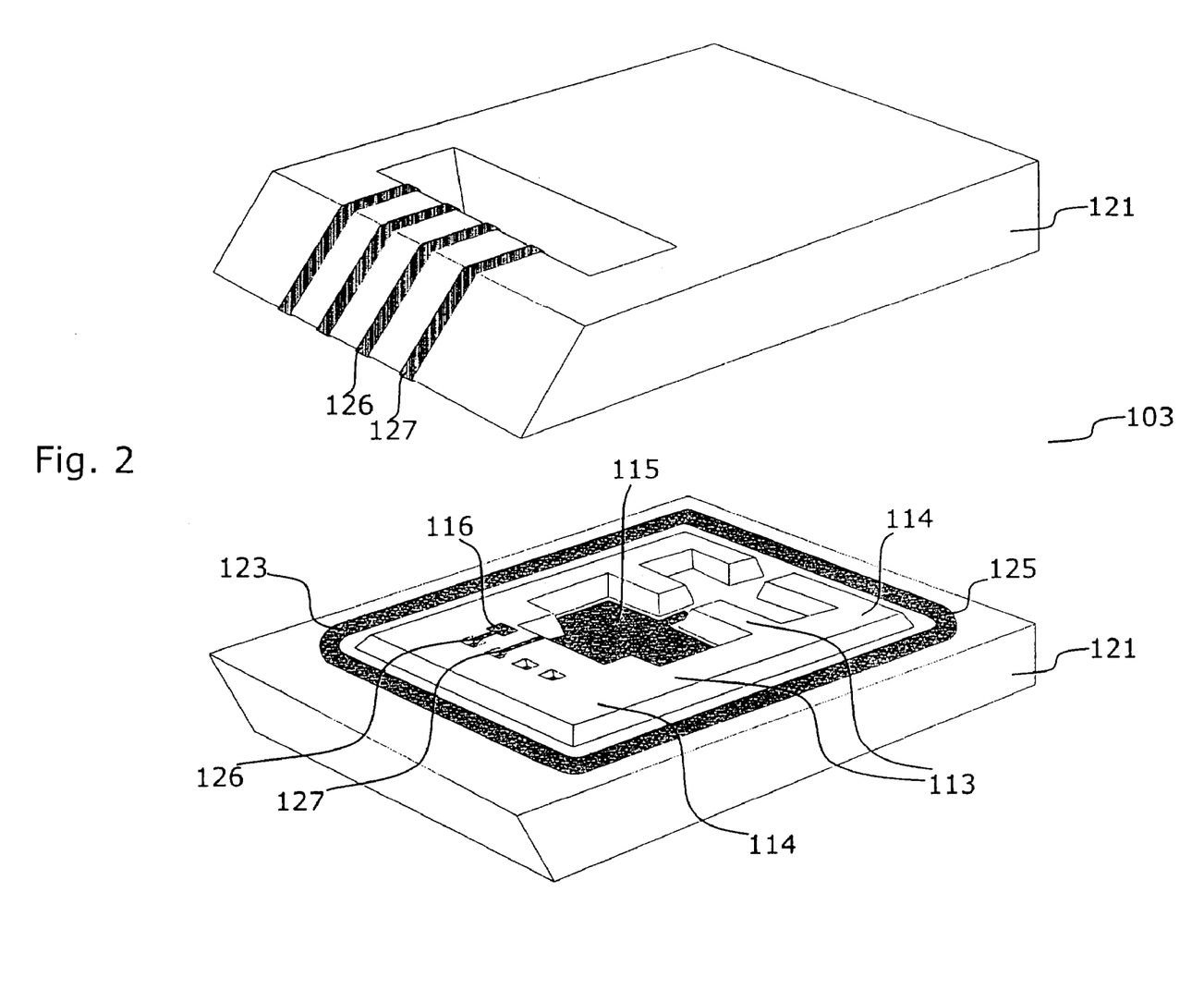
FIG. 2 is a perspective view of a carrier structure of the optical structure of FIG. 1.

FIG. 2 shows a perspective view of the carrier structure of the optical structure of FIG. 1, where the top part of the figure shows carrier structure 103 shown from above, and where the lower part of the figure shows the carrier structure 103 up-side down to give a bottom view of the carrier structure 103.

For FIGS. 2, 4, 5 and 9 there is shown four through-holes with four through-hole interconnections or feed-through metallizations, of which only two, 126 and 127, are used for providing contact to the laser 104. Thus, only two through-holes and interconnections need to be formed in the carrier structure 103, but for other purposes, four through-holes and interconnections may be wanted.

Figure 3:
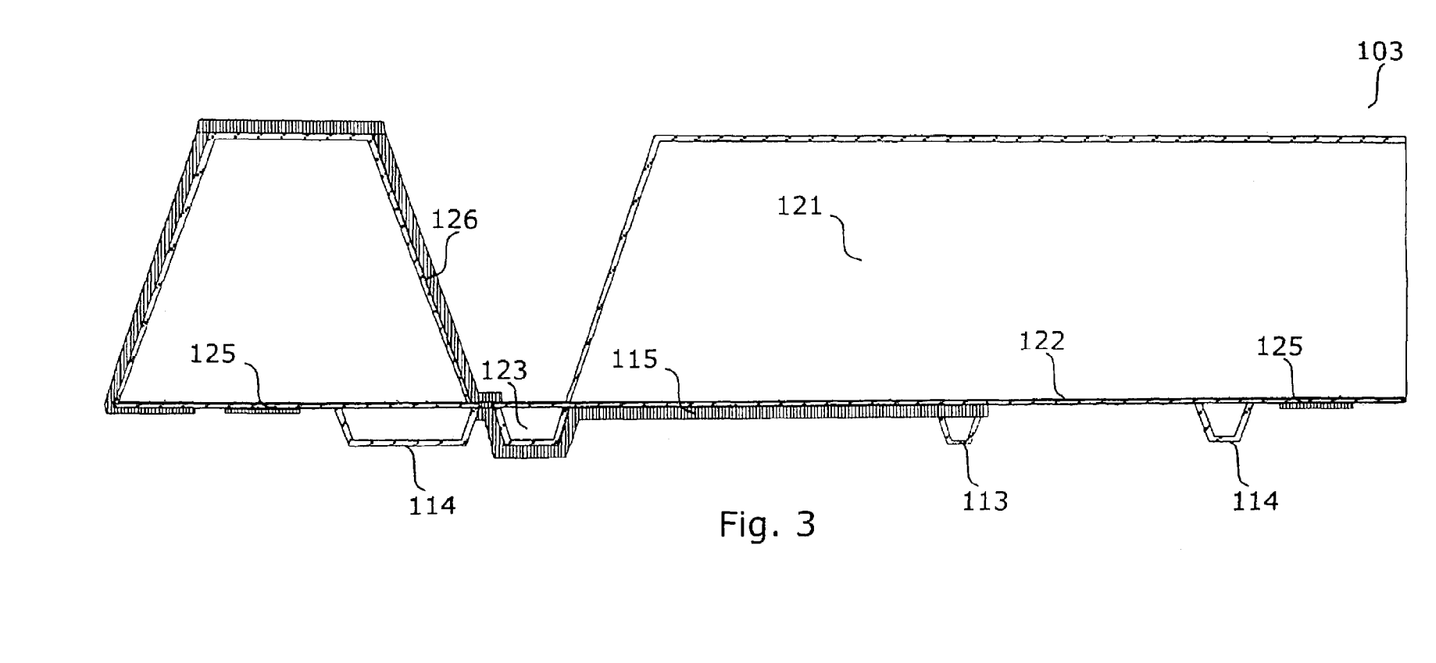
FIG. 3 is a cross-sectional side view of the carrier structure of FIG. 2.

FIG. 3 shows a cross-sectional side view of the carrier structure 103, and it is illustrated how the first and second contact surfaces 113, 114 are formed on the lower surface of the silicon back layer 123. The silicon back layer may be covered by a SiO2 layer.

Figure 4:
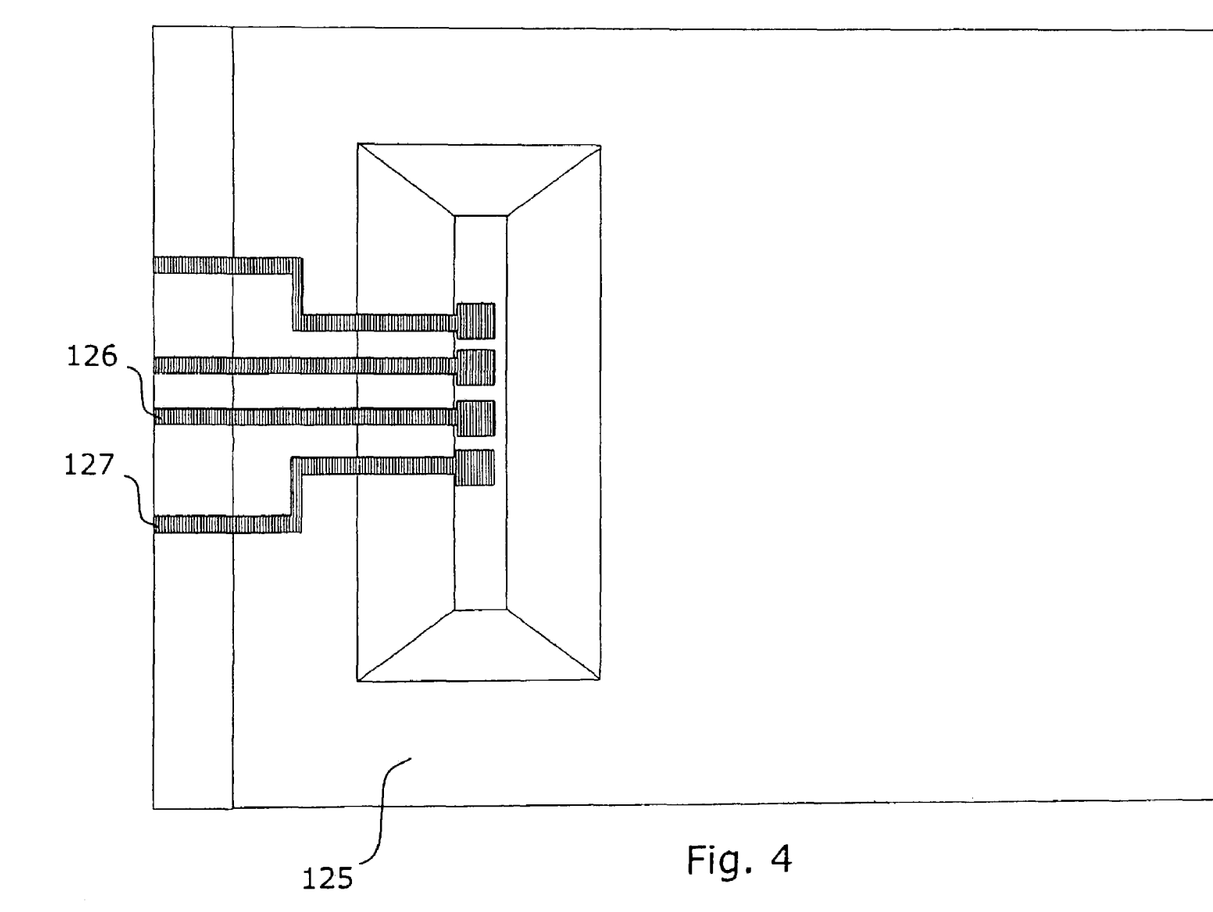
FIG. 4 is a top plan view of the carrier structure of FIG. 2.
Figure 5:
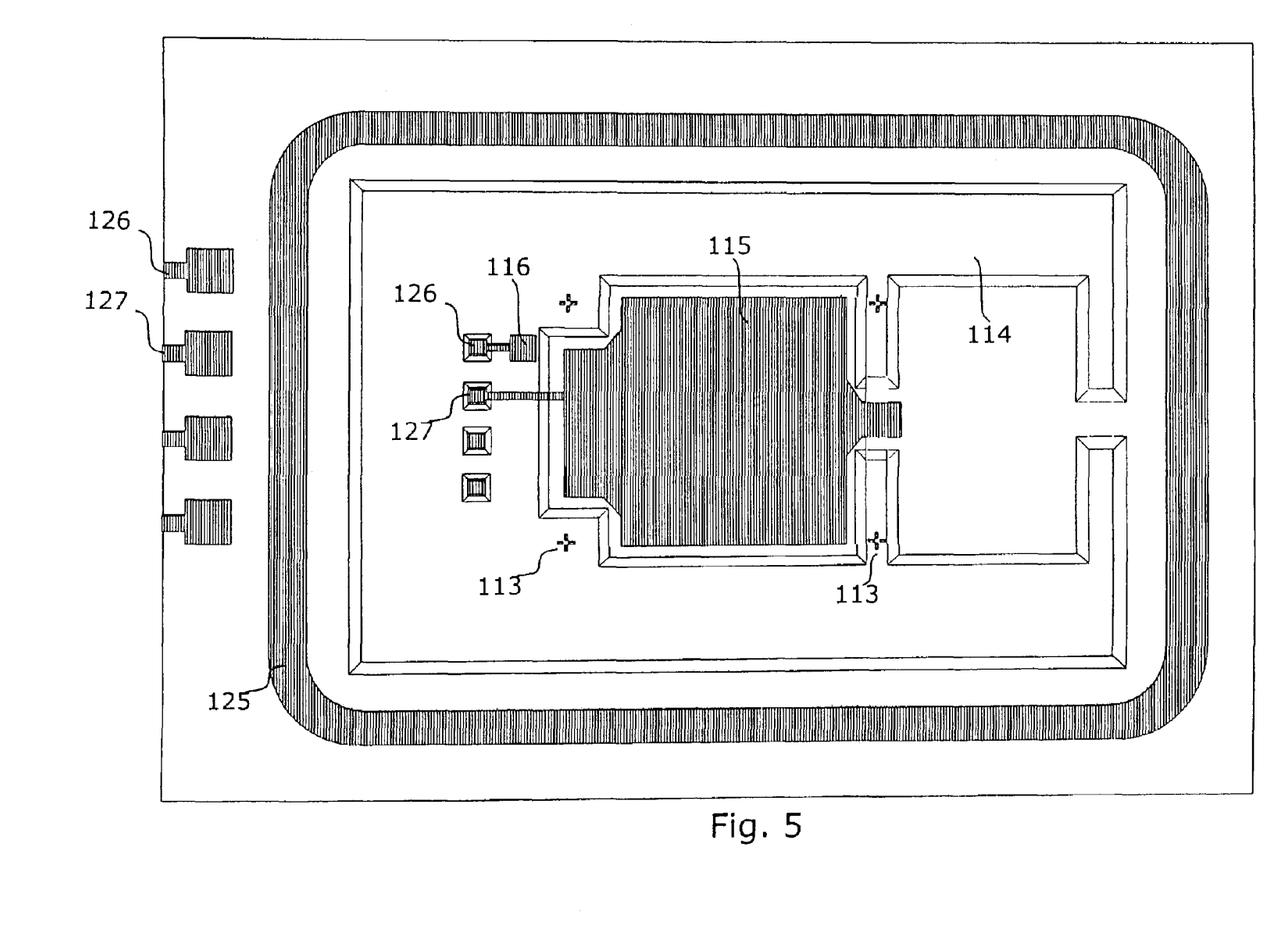
FIG. 5 is a bottom plan view of the carrier structure of FIG. 2.

FIG. 4 shows a top plan view of the carrier structure 103, and FIG. 5 shows a bottom plan view of the carrier structure 103.

Figure 6:
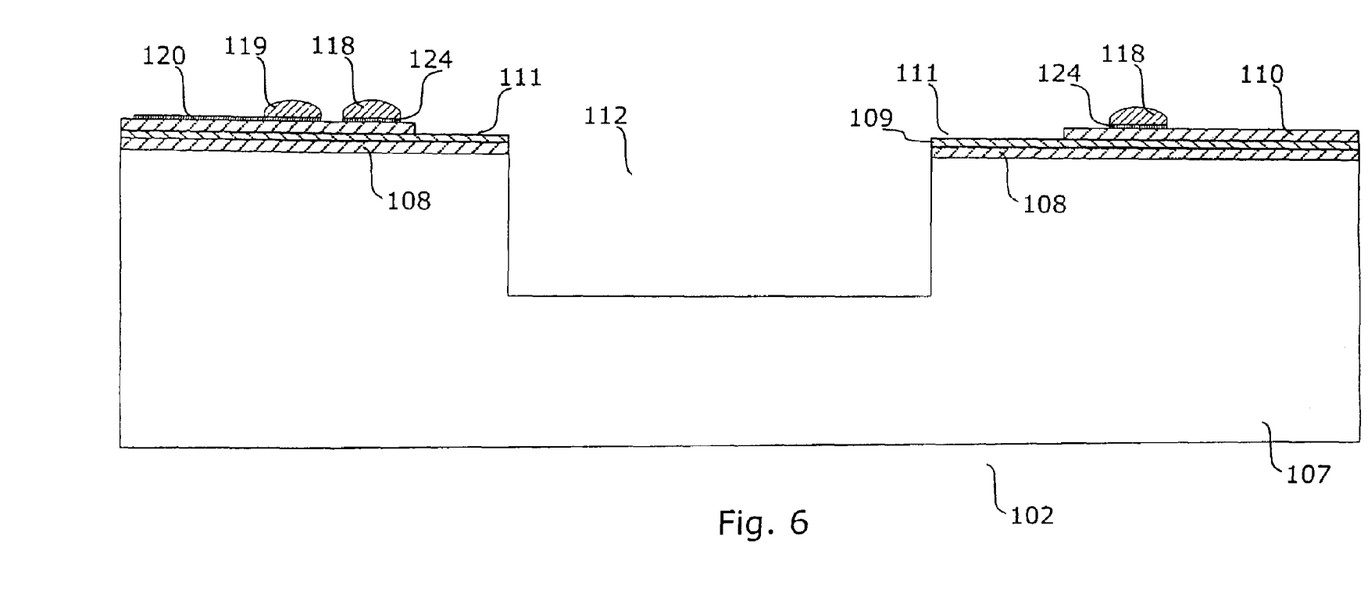
FIG. 6 is a cross-sectional side view of a substrate structure of the optical structure of FIG. 1.
Figure 7:
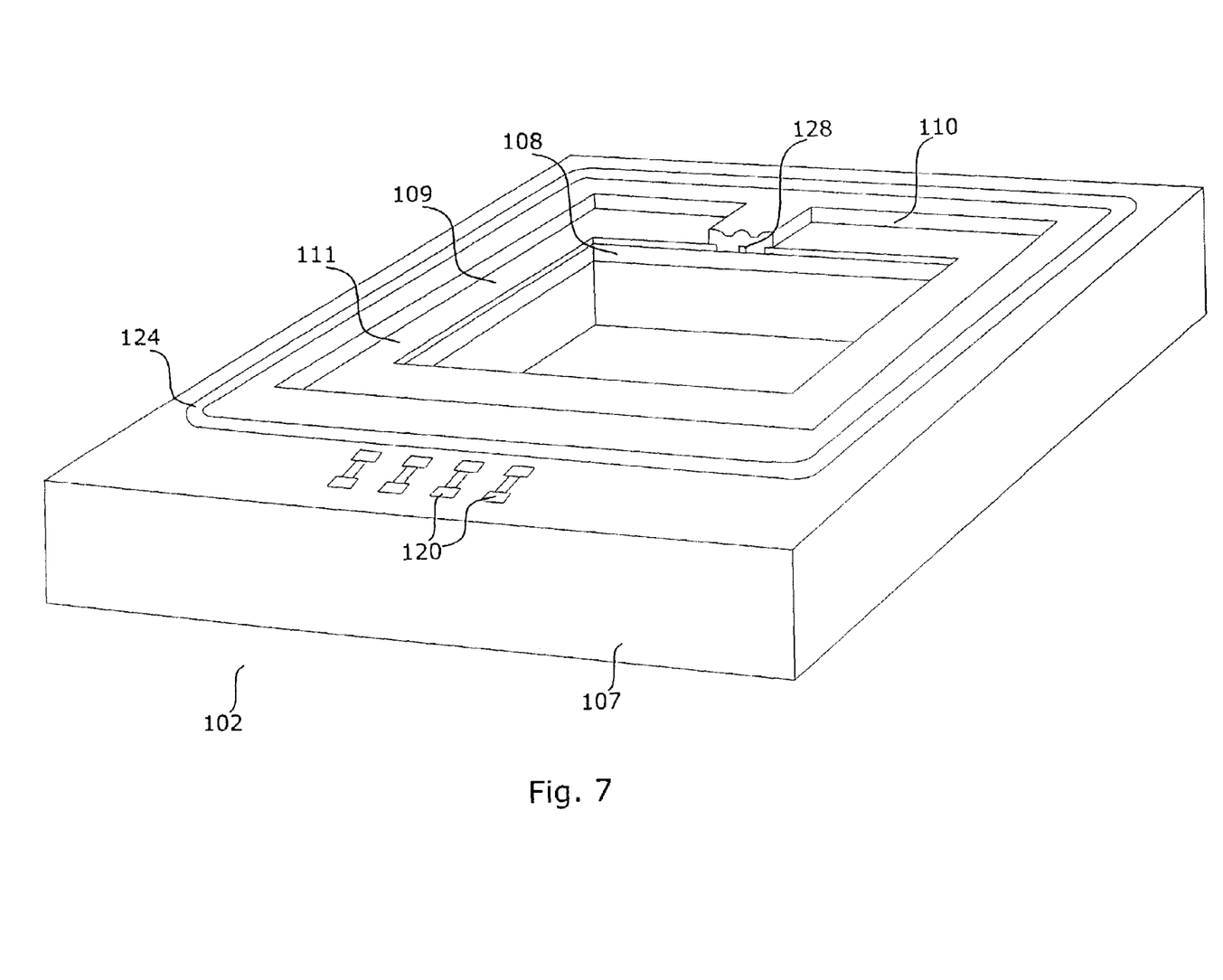
FIG. 7 is a perspective view of the substrate structure of FIG. 6.

FIG. 6 shows a cross-sectional side view of the substrate structure 102 of the optical structure of FIG. 1, and in FIG. 7 is shown a perspective view of the substrate structure 102. In FIG. 7 it is illustrated how the waveguide core 128 is arranged and formed in the core layer 109. Here, a part of the core layer 109 is removed in order to obtain a waveguide core 128 of the right dimensions. The top cladding layer 110 fills the removed parts of the core layer 109. It is seen from FIG. 7 that the uncovered part of the core layer 109 can serve as an upper waveguide height reference surface being in plane with the upper surface of the waveguide core 128. On FIG. 7 there is shown four contact metallizations 120, and again only two may be needed.

Figure 8:
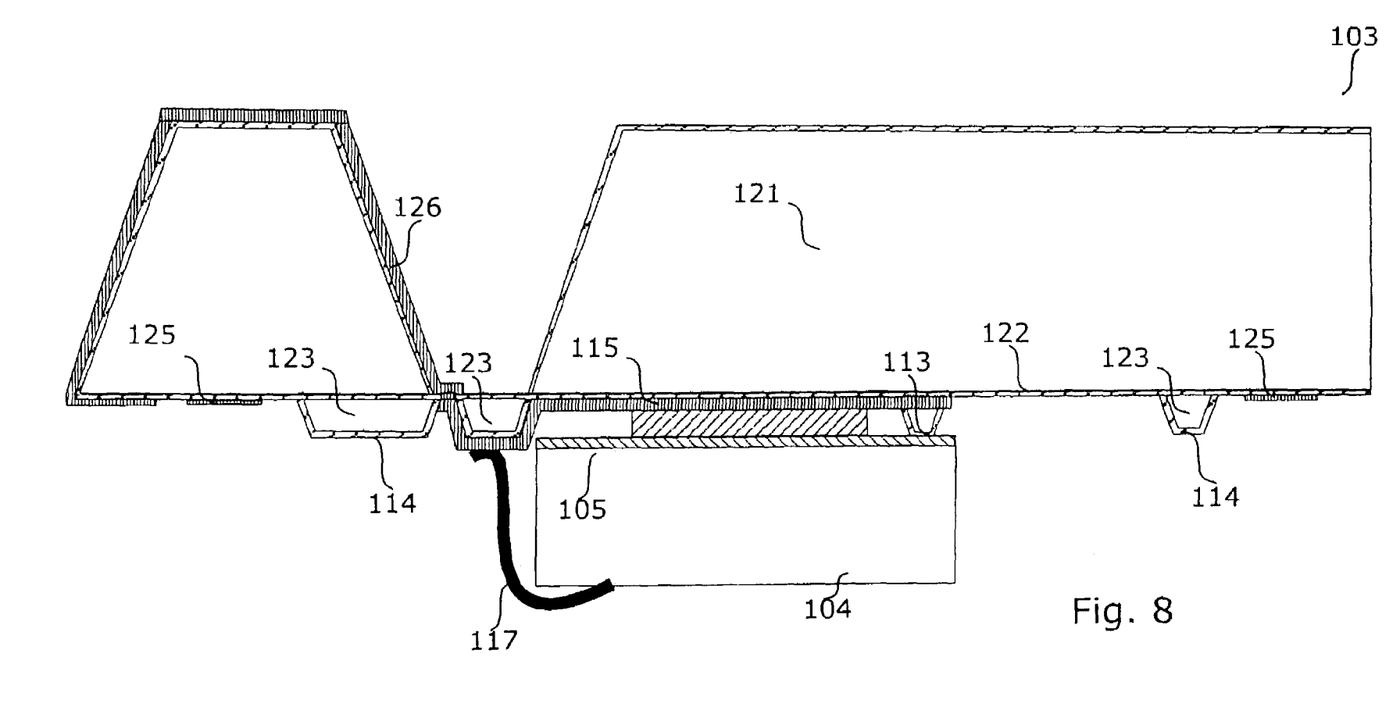
FIG. 8 is a cross-sectional side view of the carrier structure of FIG. 2 with an optical or optoelectronic component mounted.
Figure 9:
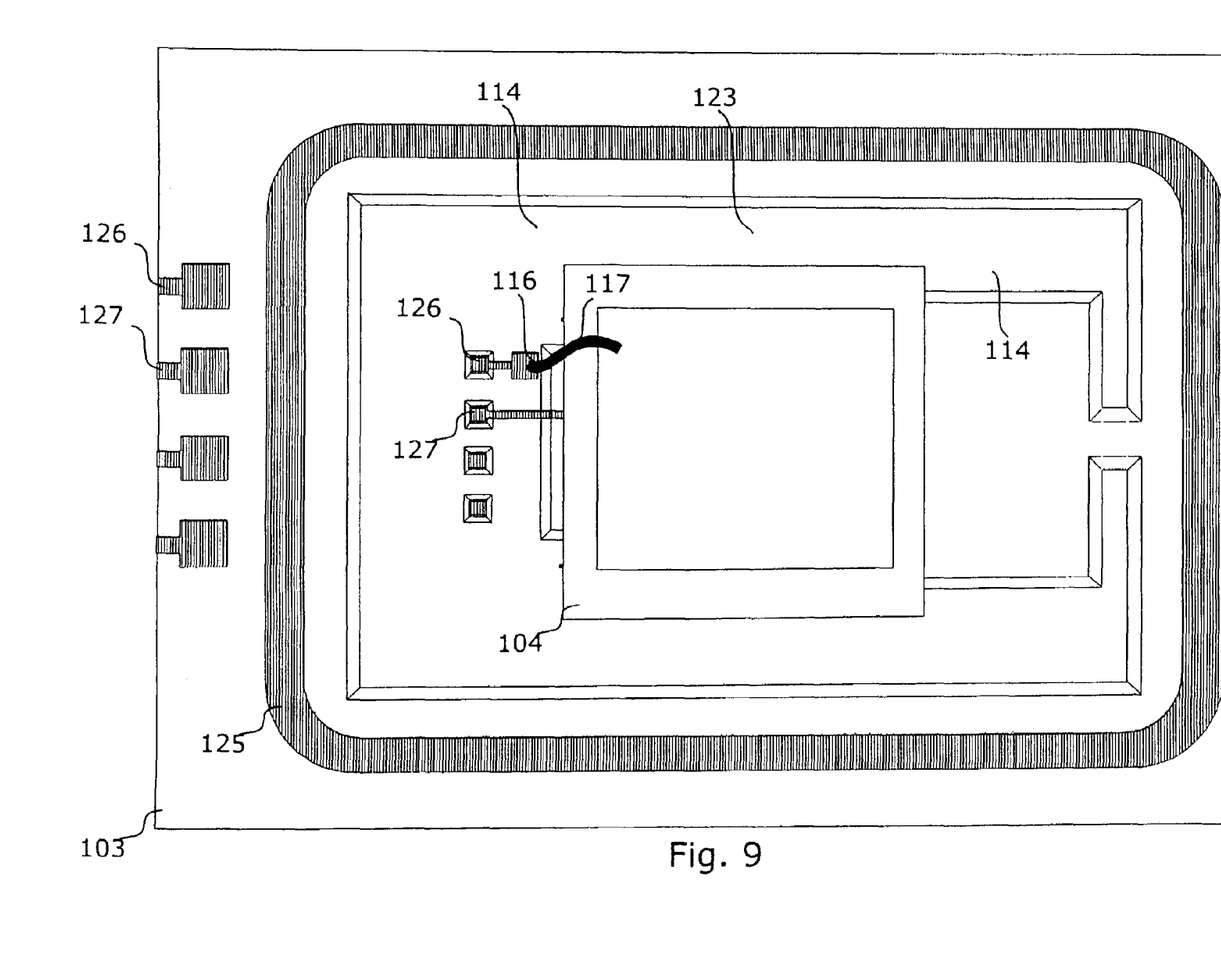
FIG. 9 is a bottom view of the carrier structure of FIG. 8 with an optical or optoelectronic component mounted.

FIG. 8 shows a cross-sectional side view of the carrier structure 103 with the optical or optoelectronic component 104 mounted, and FIG. 9 shows a bottom view of the carrier structure 103 with the optical or optoelectronic component 104 mounted.

Figure 10:
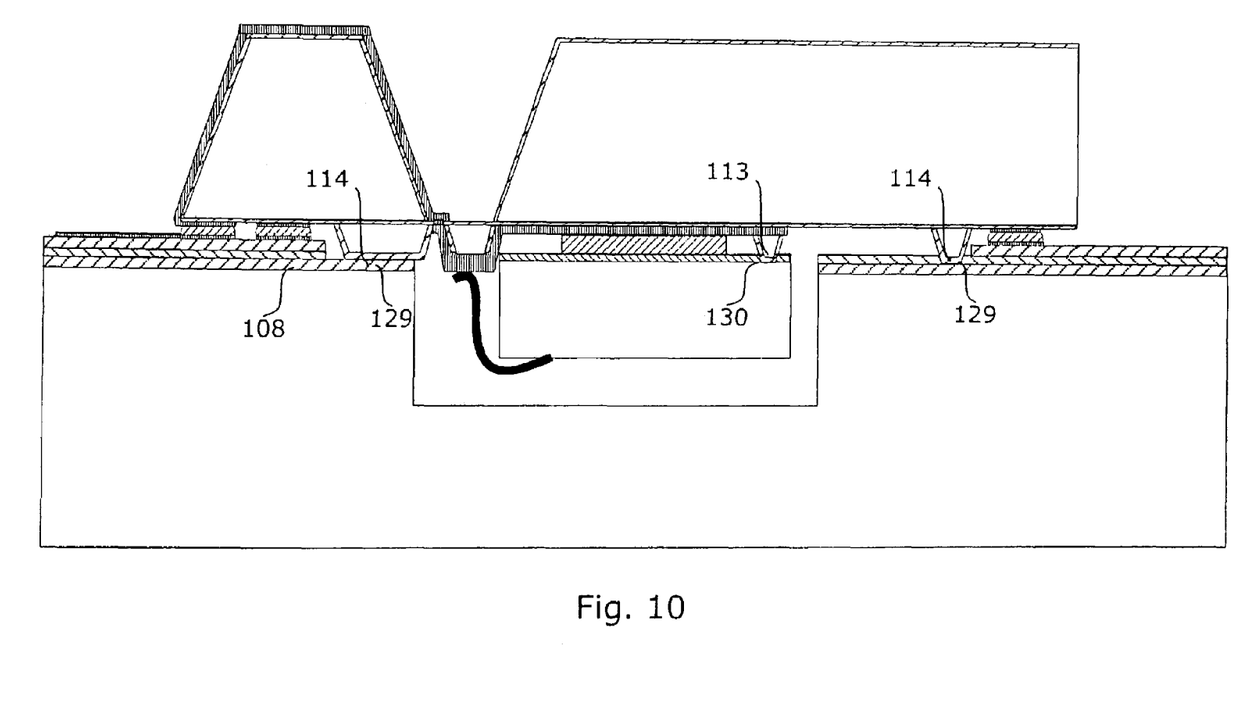
FIG. 10 is a cross-sectional side view of another embodiment of an optical structure according to the present invention.

FIG. 10 is a cross-sectional side view of another embodiment of an optical structure according to the present invention. This embodiment is very much similar to the embodiment of FIG. 1 and the same reference numerals may be used for the different parts of the figure. However, it is only the parts that differ from FIG. 1, and a few other parts, which are given reference numerals in FIG. 10. For the embodiment of FIG. 10, further parts of the core layer 109 have been removed to thereby obtain a lower waveguide height reference surface or surfaces 129. Thus, the second contact surfaces 114 of the carrier structure are resting directly on the bottom cladding layer 108. The optical component 104 is a ridge type laser having the active layer 105 formed above or on top of the upper surface of the component 104, and the first contact surfaces 113 of the carrier structure 103 are resting on the upper surface of the component 104 and below the active layer 105. Hereby vertical optical alignment can be obtained between the active layer 105 and the waveguide core 128.

In order to obtain a horizontal alignment of the active layer 105 to the waveguide core 128, the optical or optoelectronic component 104 should first be mounted to the carrier 103. The carrier 103 is then placed on the substrate structure 102, and when the optical or optoelectronic component 104 is a light emitting type such as a laser diode, optically alignment in the horizontal plane may comprise powering of the optoelectronic component 104 and monitoring the optical power transmitted through the substrate waveguide core 128 while moving the carrier 103 to thereby move the optoelectronic component 104. The optoelectronic component 104 is powered via the feed-through metallizations 126, 127. When the active layer 105 of the optoelectronic component 104 has been aligned with the waveguide core 128, the carrier structure 103 is secured to the substrate structure 102 by soldering via the soldering ring 118.

In order to ensure a fast and gentle fastening of the carrier structure 103 to the substrate structure 102, the carrier structure 103 may be pre-bonded to the substrate structure after the optical alignment, preferably by using UV curable glue dispensed at at least one point on the carrier 103 or on the substrate structure 102, so as to at least temporarily fix the carrier structure to the substrate structure.

One of the major advantages of the optical structure of the present invention is that the optical or optoelectronic component 104 is secured to the carrier structure 103. This allows a test of the optoelectronic component 104 when secured to the carrier structure but before the carrier structure 103 is secured to the substrate structure. Such a test may reduce overall production costs since the carriers 103 provided with an optoelectronic component 104 failing the test can be discarded before being secured to the substrate structure 102, whereby a cost reduction can be obtained.

The test procedure may typically include a functional test of a number of optical or optoelectronic components 104 each mounted on a corresponding carrier structure 103, and the test procedure may include a burn-in of each of the mounted optical or optoelectronic components 104. By running the components 104 at high currents for a shorter period of time, the wear of a normal operation over a longer period of time may be simulated. Thus, the failing components 104 can be disposed prior to the mounting of the carrier structure 103 on the substrate structure 102. The functional test of the mounted optical or optoelectronic components 104 is normally performed after the burn-in so that the functional testing are not wasted on the worn out components.

As an example on a burn-in test, then for a high power signal laser diode the burn-in test may be performed at around 80° C. for around 100 hours and with the laser drawing a current around 140 mA. Here, it is important for the lifetime test of the laser diode that the current results in a current density of around 40 kA/cm2. Thus, the test current may be determined by the cross-sectional area of the laser diode.

Other implementations are within the scope of the claims.

What is claimed is:

1. An optical structure comprising:
    a substrate structure having a support layer supporting a core layer of a waveguide structure, said substrate structure being provided with a recess extending below the core layer and adapted to receive an optical or optoelectronic component,
    wherein the core layer has an uncovered part to provide a waveguide height reference surface part in plane with an upper surface of the core layer of the waveguide,
    the optical structure further comprising:
    a carrier structure having a first contact surface part for mounting the optical or optoelectronic component, and a second contact surface part for mounting the carrier structure on the substrate structure, the first and second contact surface parts having well defined relative vertical positions,
    wherein the first contact surface part is adapted to contact an upper surface part of the optical or optoelectronic component, and the second contact surface part is adapted to rest on the waveguide height reference surface part of the substrate structure to provide vertical alignment between the waveguide core of the substrate structure and the first contact surface part of the carrier structure.

2. An optical structure comprising:
    a substrate structure having a support layer supporting a core layer of a waveguide structure, said substrate structure being provided with a recess extending below the core layer and adapted to receive an optical or optoelectronic component,
    wherein the support layer has an uncovered part to provide a waveguide height reference surface part in plane with a lower surface of the core layer of the waveguide,
    the optical structure further comprising:
    a carrier structure having a first contact surface part for mounting the optical or optoelectronic component, and a second contact surface part for mounting the carrier structure on the substrate structure, the first and second contact surface parts having well defined relative vertical positions,
    wherein the first contact surface part is adapted to contact an upper surface part of the optical or optoelectronic component, and the second contact surface part is adapted to rest on the waveguide height reference surface part of the substrate structure to provide vertical alignment between the waveguide core of the substrate structure and the first contact surface part of the carrier structure.

3. An optical structure according to claim 1 or claim 2 wherein the support layer of the substrate structure comprises a bottom cladding layer.

4. An optical structure according to claim 1 or claim 2 wherein said optical or optoelectronic component has a waveguiding part,
    wherein the optical or optoelectronic component is attached to the carrier structure with the first contact surface part contacting an upper surface part of the optical or optoelectronic component, and
    wherein the carrier structure is attached to the substrate structure with the optical or optoelectronic component being at least partly received in the recess, with the second contact surface part resting on the waveguide height reference surface part of the substrate structure, thereby providing vertical alignment between the waveguide core of the substrate structure and the optical or optoelectronic component.

5. An optical structure according to claim 4 wherein the core of the waveguide has a thickness greater than the thickness of the waveguiding part of the optical or optoelectronic component.

6. An optical structure according to claim 1 wherein the upper surface of the waveguiding part is arranged in plane with or below an upper surface part of the optical or optoelectronic component abutting the first contact surface part, and wherein the second contact surface part is resting on the waveguide height reference surface part.

7. An optical structure according to claim 4 wherein the waveguiding part of the optical or optoelectronic component is buried at a first distance below the upper surface part of the optical or optoelectronic component, said first distance being the distance from the upper surface part of the optical or optoelectronic component to the upper surface of the waveguiding part, and said first distance being smaller than the thickness of the waveguide core.

8. An optical structure according to claim 2 wherein the lower surface of the waveguiding part is arranged in plane with or above an upper surface part of the optical or optoelectronic component abutting the first contact surface part, and wherein the second contact surface part is resting on the waveguide height reference surface part.

9. An optical structure according to claim 4 wherein the waveguiding part of the optical or optoelectronic component is arranged at a second distance above the upper surface part of the optical or optoelectronic component, said second distance being the distance from the upper surface part of the optical or optoelectronic component to the lower surface of the waveguiding part, and said second distance being smaller than the thickness of the core of the waveguide.

10. An optical structure according to claim 1 or claim 2 wherein the waveguiding part of the optical or optoelectronic component comprises a ridge formed waveguiding part.

11. An optical structure according to claim 1 or claim 2 wherein the waveguiding part of the optical or optoelectronic component comprises a buried waveguiding part.

12. An optical structure according to claim 1 or claim 2 wherein the carrier structure compnses a semiconductor-insulator-semiconductor structure.

13. An optical structure according to claim 1 or claim 2 wherein the carrier structure has an upper part and a lower part with the first and second contact surface parts being arranged on the lower part and wherein one or more electrical contacts are provided for the optical or optoelectronic component via through holes from the upper part to the lower part.

14. An optical structure according to claim 1 or claim 2 wherein the first and second contact surface parts lies at least substantially in the same plane.

15. An optoelectronic structure according to claim 1 or claim 2 wherein the substrate structure comprises a planar lightwave circuit (PLC).

16. An optical carrier structure comprising:
an upper semiconductor structure, a lower semiconductor structure, and a substantially etch-resistant layer arranged between the upper and lower semiconductor structure,
wherein the lower semiconductor structure comprises a first contact surface part for mounting of an optical or optoelectronic component, and a second contact surface part for mounting the carrier structure on a substrate structure, wherein the first and second contact surface parts lie substantially in the same plane, the lower semiconductor structure having a cavity with an electrode therein for electrical contact to the optical or optoelectronic component, the cavity being contiguous with a hollowed-out area in the lower semiconductor structure, the hollowed-out area shaped to receive an optical waveguide formed on the substrate structure, and the hollowed-out area extending through a periphery of the lower semiconductor structure.

17. An optical carrier structure according to claim 16 wherein one or more electrical contacts are provided for the optical or optoelectronic component via through holes from the upper semiconductor structure, through the etch-resistant layer to the lower semiconductor structure.

18. A method of producing an optical structure comprising (i) an optical or optoelectronic component comprising a waveguiding part, (ii) a substrate structure having a layer in which a waveguide is formed and having a recess extending below the waveguide layer to receive the optical or optoelectronic component and (iii) a carrier structure to carry the optical or optoelectronic component, the method comprising:
mounting the optical or optoelectronic component on the carrier structure by abutting a first contact surface part of the carrier structure to an upper surface part of the optical or optoelectronic component and at least temporarily attaching the optical or optoelectronic component to the carrier structure,
exposing at least one of (i) an upper surface part of the waveguide layer of the substrate structure and (ii) part of an upper surface of a layer supporting the waveguide layer of the substrate structure, said exposed part providing a height reference surface part, and
mounting the carrier structure carrying the optical or optoelectronic component on the substrate structure so as to receive the optical structure in the recess by supporting a second contact surface part of the carrier structure on the height reference surface part of the substrate structure, wherein the first and second contact surface parts lie substantially in the same plane.

19. A method according to claim 18 including defining a height of the first and second contact surface parts in the same process steps.

20. A method according to claim 18 including defining a position of the first and second contact surface parts in a single mask process step.

21. A method according to claim 18 wherein mounting the carrier structure on the substrate structure comprises at least temporarily attaching the carrier structure to the substrate structure by pre-bonding using UV curable glue.

22. A method according to claim 18 comprising testing the optical or optoelectronic component after mounting it on the carrier structure and prior to mounting the carrier structure to the substrate structure.

23. A method of assembling an optical structure, said method comprising:
mounting each of one or more substantially identical optical or optoelectronic components onto a corresponding carrier structure, wherein electrical wiring is provided in the carrier structure and wherein said mounting comprises connecting the mounted component to the carrier structure with the electrical wiring, whereby the component can be powered,
testing each of said one or more optical or optoelectronic components when mounted on the corresponding carrier structure, wherein said testing includes a functional test of the one or more mounted optical or optoelectronic components,
selecting the carrier structure holding an optical or optoelectronic component, which has passed the test procedure, and
securing or mounting the selected carrier structure holding the tested optical or optoelectronic component onto a substrate structure, said substrate structure having a substrate waveguide for being optically coupled to the tested optical or optoelectronic component.

24. A method according to claim 23, said method further comprising performing an optical alignment of the mounted and tested optical or optoelectronic component with the substrate waveguide before securing the selected carrier structure to the substrate structure.

25. A method according to claim 24 wherein the optical or optoelectronic component is a light emitting type of optoelectronic component and wherein optically aligning comprises powering of the optoelectronic component and monitoring the optical power transmitted through the substrate waveguide while moving the carrier structure to thereby move the optoelectronic component.

26. A method according to claim 24 comprising pre-bonding the carrier structure to the substrate structure after the said optical alignment to at least temporarily fix the carrier structure to the substrate structure.

27. A method according to claim 26 wherein the pre-bonding is carried out using UV curable glue.

28. A method according to claim 23 wherein said testing includes a burn-in of each of the one or more mounted optical or optoelectronic components.

29. A method according to claim 28 wherein the functional test of the mounted optical or optoelectronic components is performed after the burn-in.

30. A method according to claim 23 wherein the selected carrier structure and the substrate structure are formed so as to provide at least partial vertical alignment between a core of the substrate waveguide and a waveguiding part of the optical or optoelectronic component when the selected carrier structure is secured to the substrate structure.

* * * * *

UNITED STATES PATENT AND TRADEMARK OFFICE
CERTIFICATE OF CORRECTION

PATENT NO. : 7,213,978 B2  
APPLICATION NO. : 10/437543  
DATED : May 8, 2007  
INVENTOR(S) : Jochen Friedrich Kuhmann and Matthias Heschel It is certified that error appears in the above-identified patent and that said Letters Patent is hereby corrected as shown below:

Column 13
Line 53, change "camer" to -- carrier --

Column 15
Line 2, change "compnese" to -- comprises --

Column 15
Line 13, change "lies" to -- lie --

Signed and Sealed this

Twenty-fourth Day of June, 2008

JON W. DUDAS  
*Director of the United States Patent and Trademark Office*